(12) United States Patent
Dai

(10) Patent No.: US 7,577,695 B2
(45) Date of Patent: Aug. 18, 2009

(54) HIGH-ORDER DELTA-SIGMA NOISE SHAPING IN DIRECT DIGITAL FREQUENCY SYNTHESIS

(75) Inventor: Fa Dai, Auburn, AL (US)

(73) Assignee: Auburn University, Auburn, AL (US)

( * ) Notice: Subject to any disclaimer, the term of this patent is extended or adjusted under 35 U.S.C. 154(b) by 868 days.

(21) Appl. No.: 11/187,365

(22) Filed: Jul. 22, 2005

(65) Prior Publication Data

US 2006/0020649 A1    Jan. 26, 2006

Related U.S. Application Data

(60) Provisional application No. 60/590,287, filed on Jul. 22, 2004.

(51) Int. Cl.
*G06F 1/02*    (2006.01)
(52) U.S. Cl. .................................................. 708/271
(58) Field of Classification Search ....................... None
See application file for complete search history.

(56) References Cited

U.S. PATENT DOCUMENTS

| | | | |
|---|---|---|---|
| 5,459,680 A * | 10/1995 | Zimmerman et al. | 708/276 |
| 5,563,535 A | 10/1996 | Corry et al. | |
| 5,864,492 A * | 1/1999 | Sadot | 708/270 |
| 6,075,474 A | 6/2000 | Gabet et al. | |
| 2001/0033200 A1 | 10/2001 | Staszewski et al. | |
| 2002/0008588 A1* | 1/2002 | Khan | 331/18 |
| 2004/0233086 A1* | 11/2004 | Kiss et al. | 341/143 |

FOREIGN PATENT DOCUMENTS

EP    1037379    2/2000

OTHER PUBLICATIONS

Vankka "A Direct Digital Synthesizer with a Tunable Error Feedback Structure" IEEE Transactions on Communications, vol. 45, No. 4, pp. 416-420, (1997).
Dai, F. et al. "Automatic Linearity (IP3) Test with Built-In Pattern Generator and Analyzer" IEEE International Test Conference, pp. 271-280, (2004).
Hui-min et al. "The New Design of Sigma-Delta Modulator with Lower Bits and its Application" IEEE Conf. Neutral Networks & Signal Processing, vol. 1, pp. 677-680, (2003).

* cited by examiner

*Primary Examiner*—David H Malzahn
(74) *Attorney, Agent, or Firm*—Andrus, Sceales, Starke & Sawall, LLP

(57) ABSTRACT

A direct digital synthesis (DDS) circuit utilizes high order delta-sigma interpolators to remove frequency, phase and amplitude domain quantization errors. The DDS employs an n-bit accumulator operative for receiving an input frequency word (FCW) representing the desired frequency output and converts the frequency word to phase information based upon the clock frequency of the DDS. A high-order delta-sigma interpolator is configured in frequency, phase or amplitude domain to noise-shape the quantization errors through a unit defined by the transfer function of $1-(1-z^{-1})^k$ in either a feed-forward or feedback manner. The delta-sigma interpolator of any order can be implemented using a single-stage pipelined topology with noise transfer function of $(1-z^{-1})^k$. The DDS circuit also includes digital-to-analog converters (DACs) that convert the outputted sine and cosine amplitude words to analog sinusoidal quardrature signals; and deglitch analog low-pass filters that remove the small glitches due to data conversion.

22 Claims, 13 Drawing Sheets

HIGH-ORDER DELTA-SIGMA NOISE SHAPING IN DIRECT DIGITAL FREQUENCY SYNTHESIS

CROSS REFERENCE TO RELATED APPLICATION

The present application is based on and claims priority under 35 U.S.C. §119(e) of the co-pending U.S. Provisional Patent Application, Ser. No. 60/590,287, filed Jul. 22, 2004, and entitled "HIGH-ORDER DELTA-SIGMA NOISE SHAPING IN DIRECT DIGITAL FREQUENCY SYTHESIS". The U.S. Provisional Patent Application, Ser. No. 60/590,287, filed Jul. 22, 2004, and entitled "HIGH-ORDER DELTA-SIGMA NOISE SHAPING IN DIRECT DIGITAL FREQUENCY SYTHESIS" is also hereby incorporated by reference.

FIELD OF THE INVENTION

The invention relates to the field of frequency synthesis. More particularly, the invention relates to the field of direct digital synthesis (DDS).

BACKGROUND OF THE INVENTION

Direct digital synthesis (DDS) is an important frequency synthesis means that provides low cost synthesis with ultra fine resolution. A basic DDS system as shown in FIG. 1a consists of a numerically-controlled oscillator (NCO) to generate the sampled signal followed by a digital-to-analog converter (DAC) used to convert the digital waveform to an analog signal. Since the DAC output is sampled at the reference clock frequency, a deglitch lowpass filter is typically used to smooth the waveform. The NCO uses an N-bit accumulator to generate a phase ramp based on the N-bit input frequency control word (FCW). A read-only memory (ROM) stores the amplitude information of the desired waveform. With the phase word as the address, the ROM's output is the amplitude word of the synthesized waveform. The FCW is continuously accumulated with the last sampled phase value by an N-bit adder. When the accumulator reaches the N-bit maximum value, the accumulator overflows and continues. The rollover rate of the accumulator is hence the DDS output frequency:

$$f_o = f_{clk} \frac{FCW}{2^N}, \qquad (1)$$

where $f_{clk}$ is the DDS sample clock frequency. According to FIG. 1a, an ideal DDS output signal can be expressed as $$S = A \sin\left(\frac{2\pi W t}{2^n T_{clk}}\right) = A \sin\left(\frac{2\pi W i}{2^n}\right) \qquad (2)$$

where A is the full-scale output magnitude of the DAC and $t=T_{clk} \cdot i$. While pure sinusoidal waveform is desired at the DDS output, spurious tones can also occur mainly due to the following nonlinear process:

(1) In order to reduce the look-up table ROM size, the phase word is normally truncated before being used as the ROM addresses. This truncation process introduces quantization noise, which can be modeled as a linear additive noise to the phase of the sinusoidal wave.

(2) The ROM word length is normally limited by the finite number of bits of the available DAC. In another word, the sinusoidal waveform can be expressed only by words with finite length, which intrinsically contains quantization error additive to the output amplitude.

Since the FCW can be stepped by unity, the resolution of the DDS is given as $f_{clk}/2^N$. A DDS can achieve a very fine resolution if the accumulator size N is large. For example, if a 32-bit accumulator is used, and the DDS operates at clock frequency of 100 MHz, its resolution is 0.0233 Hz. However, fine resolution relies on a large number of accumulator bits, which corresponds to a long phase word. Note that the ROM size is proportional to the addressing range $2^N$. As a result, a large ROM look-up table is required. In order to reduce the ROM size while keeping a fine step size, only the most significant P bits of the phase word are used to address the ROM. This truncation at the accumulator output causes a quantization error that will be discussed later. The ROM size is equal to $2^P \cdot D$, where D is the number of amplitude bits and is determined by the number of DAC input bits. While increasing the number of phase bits is always feasible, increasing the number of DAC input bits is limited by the semiconductor technology. Even if the desired number of DAC bits can be implemented using an available technology, adding bits is costly due to large increases in die size and power consumption. Therefore, the goal of DDS design is to minimize the phase truncation error such that the DDS output noise is dominated by the DAC quantization noise.

An additional DDS is shown in FIG. 1b and includes a digital accumulator 10 that generates a phase word of p-bits (p) based on the input frequency word of n-bits (n). The DDS utilizes a look-up table 20 to convert the phase word (p) to a sinusoidal amplitude word (D), whose length is normally limited by the finite number of input bits of the digital-to-analog converter (DAC) 30. The sine and cosine look-up table output both sine (0 degree) and cosine (90 degree) quadrature signals. Deglitch filters 40 are added after the DAC 30 to remove the spurious components generated in the data conversion process.

Considering the quantization errors due to phase truncation $e_{p1}$ and amplitude truncation (finite ROM word length) $e_{A1}$ and assuming the phase quantization error is small relative to the phase, the ideal DDS output given in (2) shall be modified as:

$$S = A \sin\left(\frac{2\pi W i}{2^n} + e_p(i)\right) + e_A(i) \qquad (3)$$

$$\approx A \sin\left(\frac{2\pi W i}{2^n}\right) + A e_p(i) \cos\left(\frac{2\pi W i}{2^n}\right) + A e_A(i)$$

Thus, the phase error is amplitude modulated on the quadrature signal with respect to the desired signal output. Eq. (3) provides a simple model for the prior art DDS output and its associated quantization errors. The following models the DDS phase truncation errors by analyzing its time sequence.

The phase truncation process introduces quantization noise, which can be modeled as a linear additive noise to the phase of the sinusoidal wave. At time step n, the N-bit phase word at the output of the N-bit phase accumulator is updated as:

$$\Phi[n+1]=(\Phi[n]+FCW)\mod 2^N \qquad (4)$$

where Φ[n] represents the phase at time step n, and AmodB represents taking the integer residue of A modulo B. For example, 26 mod16=10. To reduce the ROM size, only the P most significant bits (MSB) of the accumulator output are used to address the look-up table. Truncating the N-bit phase word into P-bits causes a truncation error $E_p$ expressed as:

$$E_p[n+1]=(E_p[n]+R)\mod 2^{N-P} \quad (5)$$

where R is the least significant (N-P)-bits of the FCW value given by:

$$R = FCW - \left\lfloor \frac{FCW}{2^{N-P}} \right\rfloor \times 2^{N-P} \quad (6)$$

where $\lfloor \; \rfloor$ denotes the truncation to keep the integer part. Hence, the output amplitude of the NCO can be expressed as:

$$S[n] = \sin\left(\frac{2\pi(\Phi[n] - E_p[n])}{2^N}\right) \quad (7)$$
$$= \sin\left(\frac{2\pi\Phi[n]}{2^N}\right)\cos\left(\frac{2\pi E_p[n]}{2^N}\right) -$$
$$\cos\left(\frac{2\pi\Phi[n]}{2^N}\right)\sin\left(\frac{2\pi E_p[n]}{2^N}\right)$$

where S[n] is the amplitude at time step n. This can be compared to the ideal sinusoidal waveform s(t) given by (2). For small truncation error, the above equation becomes:

$$S[n] \approx \sin\left(\frac{2\pi\Phi[n]}{2^N}\right) - \frac{2\pi E_p[n]}{2^N} \cdot \cos\left(\frac{2\pi\Phi[n]}{2^N}\right) \quad (8)$$

The first term gives the desired sinusoidal output and second term is the error introduced by phase truncation. As shown, the phase truncation error gives an amplitude-modulated term on the quadrature output. The phase error sequence represented by the truncated N-P bits satisfies the condition that $|E_p[n]|<2^{N-P}$.

SUMMARY OF THE INVENTION

A direct digital synthesis (DDS) circuit utilizes high order delta-sigma interpolators to remove frequency, phase and amplitude domain quantization errors. The DDS employs an n-bit accumulator operative for receiving an input frequency word (FCW) representing the desired frequency output and converts the frequency word to phase information based upon the clock frequency of the DDS. A high-order delta-sigma interpolator is configured in frequency, phase or amplitude domain to noise-shape the quantization errors through a unit defined by the transfer function of $1-(1-z^{-1})^k$ in either a feedforward or feedback manner. The delta-sigma interpolator of any order can be implemented using a single-stage pipelined topology with noise transfer function of $(1-z^{-1})^k$. The DDS circuit also includes digital-to-analog converters (DACs) that convert the outputted sine and cosine amplitude words to analog sinusoidal quadrature signals; and deglitch analog low-pass filters that remove the small glitches due to data conversion.

A direct digital synthesis (DDS) architecture and method to remove phase and amplitude quantization errors utilizing an n-bit accumulator operative for receiving an input frequency word representing the desired frequency output and for converting the frequency word to phase information based upon the clock frequency of the DDS. A high-order delta-sigma interpolator which takes the (n-p)-bit truncated frequency error word as its input and processes it through a unit defined by the transfer function of $1-(1-z^{-1})^k$. A high-order delta-sigma interpolator which takes the (n-p)-bit phase truncation error word as its input and processes it through a unit defined by the transfer function of $1-(1-z^{-1})^k$. A sin/cos loop-up table which can be addressed using the phase word. High-order delta sigma interpolators, which take the (L-D)-bit sin and cos truncation error words as the inputs and process them through delay units defined by the transfer function of $1-(1-z^{-1})^j$. Digital-to-analog converters (DACs) that convert the sin and cos amplitude words to analog sinusoidal quadrature signals; and deglitch analog low-pass filters that remove the small glitches due to data conversion and also filter the quantization noises that have been shifted to higher frequency band by delta-sigma interpolators.

DETAILED DESCRIPTION OF THE DRAWINGS

It is shown that the phase truncation process associated with the conventional DDS architecture introduces quantization error. This work proposes novel delta-sigma modulators that can be used to reduce the quantization noise and spurious tones of the DDS. Delta-sigma modulations are proposed to be implemented in frequency, phase, and/or amplitude domains in DDS. The frequency domain delta-sigma modulation gains advantages of increased dynamic range due to constant input and reduced accumulator size due to frequency control word truncation in frequency domain. The following noise shaping technique can be used to either increase the DDS resolution for high performance applications or to reduce the ROM size for low cost applications. Using the delta-sigma interpolator to remove the phase truncation error, we can build larger accumulator (e.g., n>32 bits) to achieve finer resolution with low quantization noise. Alternatively, without degrading the output spectral purity, we can truncate even more phase bits to obtain smaller ROM size.

Figure 2:
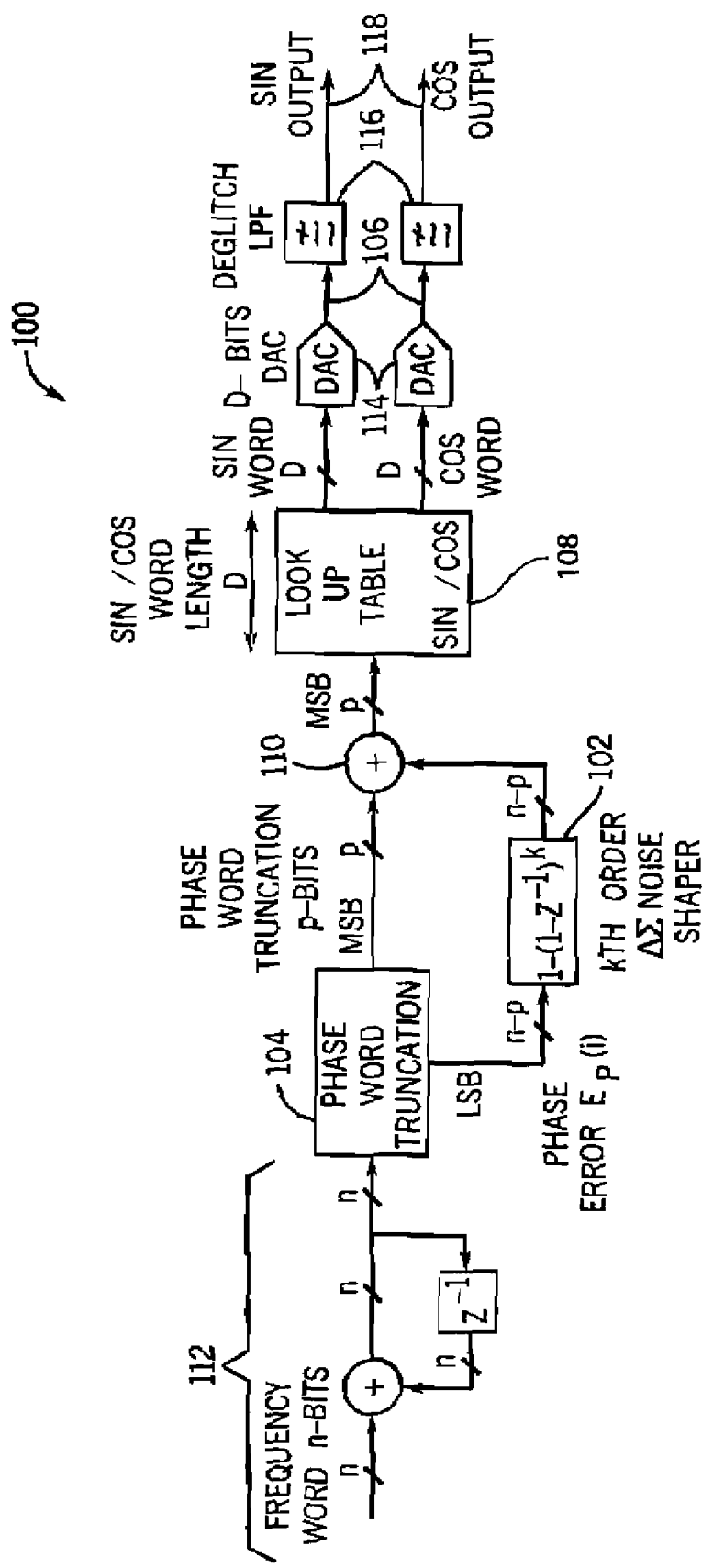
FIG. 2 illustrates a block diagram of a DDS with phase domain delta-sigma noise shaper according to an embodiment of the present invention.

FIG. 2 illustrates a block diagram of a kth order phase domain delta-sigma noise shaper used to shape the phase truncation error in a DDS in accordance with the present invention.

Figure 1A:
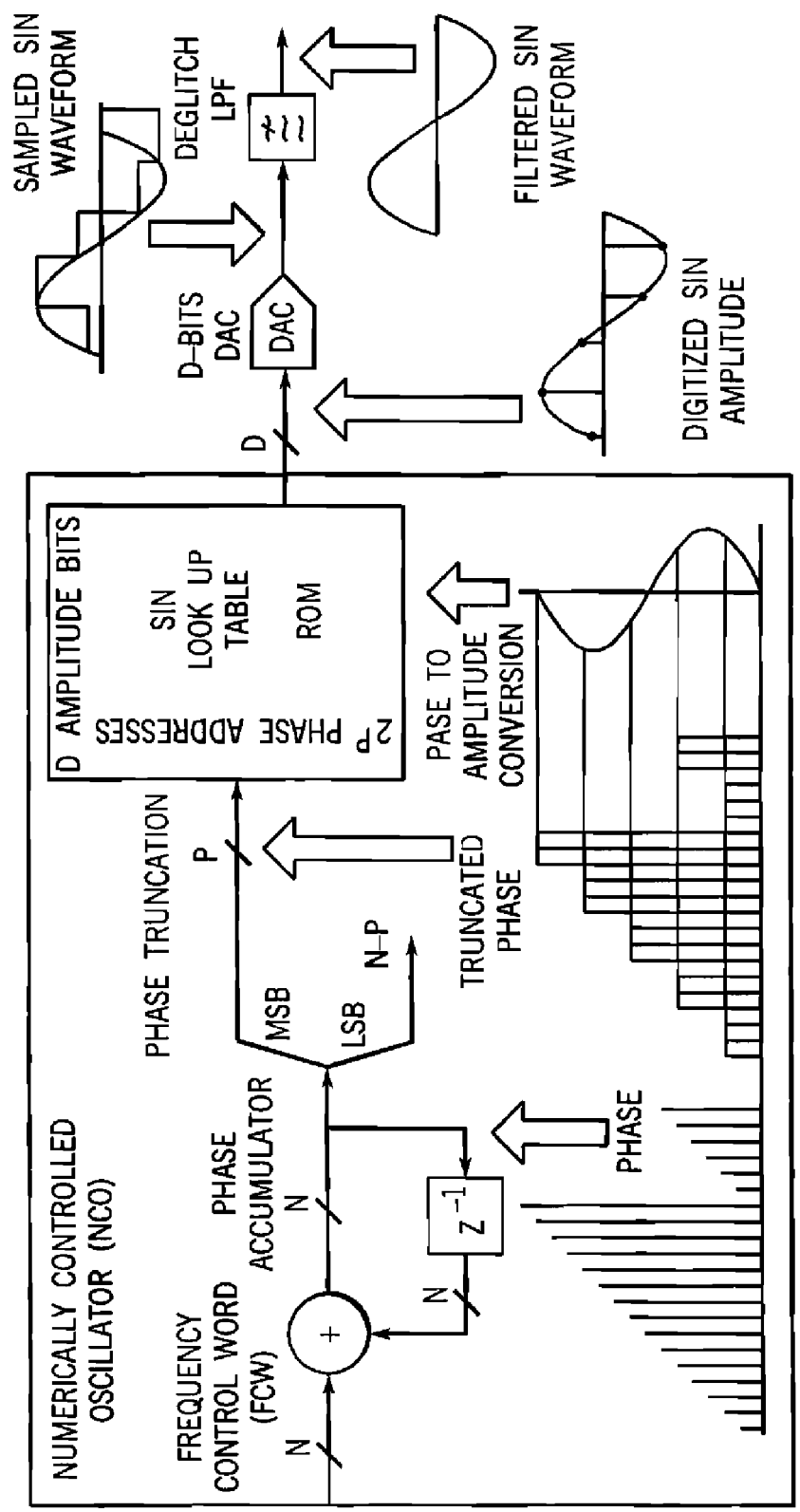
FIGS. 1a and 1b illustrate a block diagram of a DDS of the prior art.
Figure 1B:
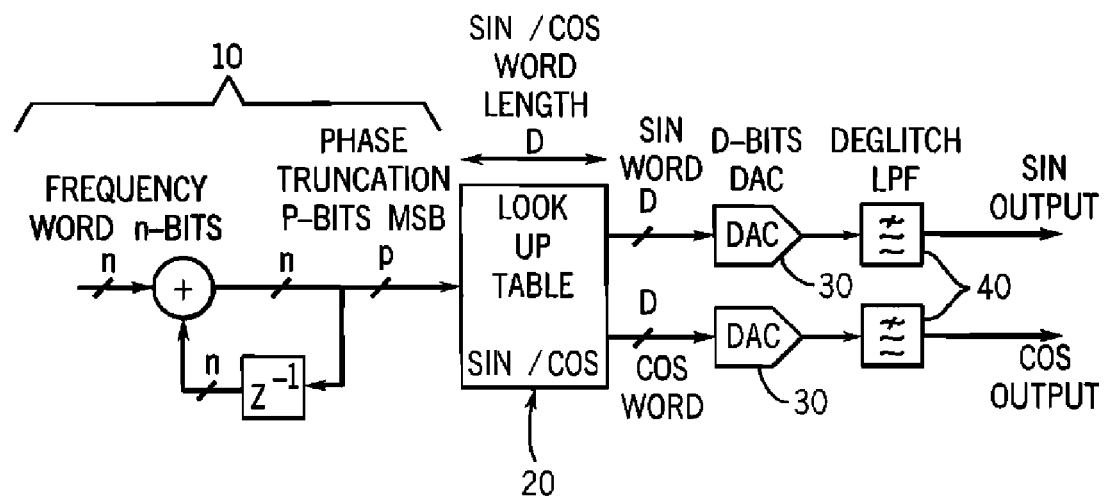

In FIGS. 1a and 1b, the phase truncation process associated with the conventional DDS architecture introduces quantization error. To avoid aliasing during data conversion, the synthesized frequency is required to be smaller than the DDS clock frequency. Thus, oversampling is always encountered in DDS, allowing noise-shaping techniques to be used to shift the phase quantization error to higher frequency band, where the noise can be eventually removed by the deglitch filter after the DAC 30. As shown in FIG. 2, a kth order delta-sigma noise shaper 102 with unique transfer function is added after the phase truncation 104. The resulting DDS output 106 can be expressed as:

$$S = A\sin\left(\frac{2\pi Wi}{2^n} + e_p(i)(1-z^{-1})^k\right) + e_A(i) \quad (9)$$

$$\approx A\sin\left(\frac{2\pi Wi}{2^n}\right) + Ae_p(i)(1-z^{-1})^k \cos\left(\frac{2\pi Wi}{2^n}\right) + Ae_A(i)$$

Still referring to FIG. 2, it can be seen that the phase error $e_p$ is high-pass filtered by the sigma-delta interpolator 102 and 110 before the amplitude modulation by the look-up table 108. This greatly reduces the close-in phase noise and de-correlates the phase truncation error. Thus, the spurious components at the DDS output 118 are greatly reduced or eliminated. The step size of the proposed DDS architecture 100 can be finer than that of conventional DDS (as shown in FIGS. 1a and 1b) due to reduced truncation noise. Since a delta-sigma interpolator 110 is available to remove the phase truncation error, a larger accumulator 112 in the range of n>32 bits can be built to achieve finer resolution with low quantization noise.

Still referring to FIG. 2, the DDS architecture 100 using a delta-sigma noise shaper 102 and 110 to remove phase truncation error can be extended in additional embodiments to include additional delta-sigma interpolators 110 to minimize the amplitude truncation error due to the finite ROM word length. Due to the nonlinearity associated with DAC analog circuitry, it is very hard to design a DAC 114 with large number of input bits. Using currently available standard CMOS technology, the DAC 114 achieves approximately 16 bits and a few hundred 100 Mb/s. The phase noise floor of a conventional DDS (FIG. 1b) is actually limited by the number of DAC 30 input bits. However, ROM word length can be easily increased at the cost of silicon area. If ROM size is not a concern, the ROM word length may be increased beyond the DAC 114 input bit number to achieve super low quantization noise. The ROM word is truncated to have the same number of bits as that of the available DAC 114 input.

Figure 3A:
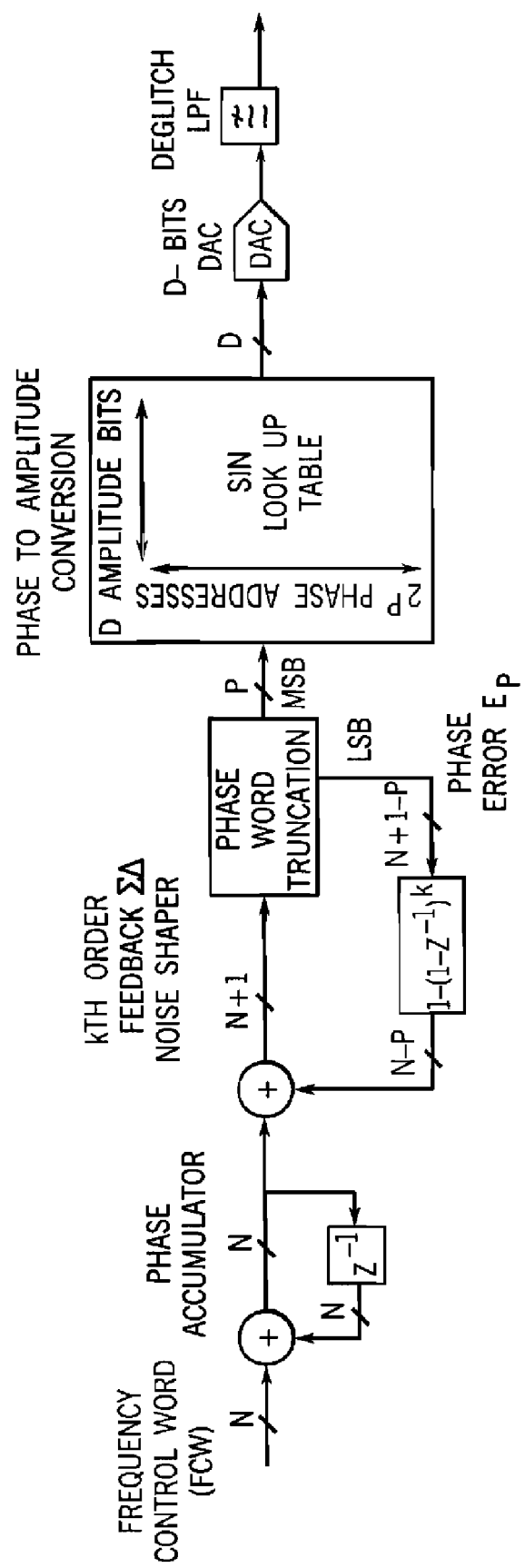
FIG. 3A illustrates a block diagram of a DDS with phase domain feedback delta-sigma noise shaper according to an embodiment of the present invention.
Figure 3B:
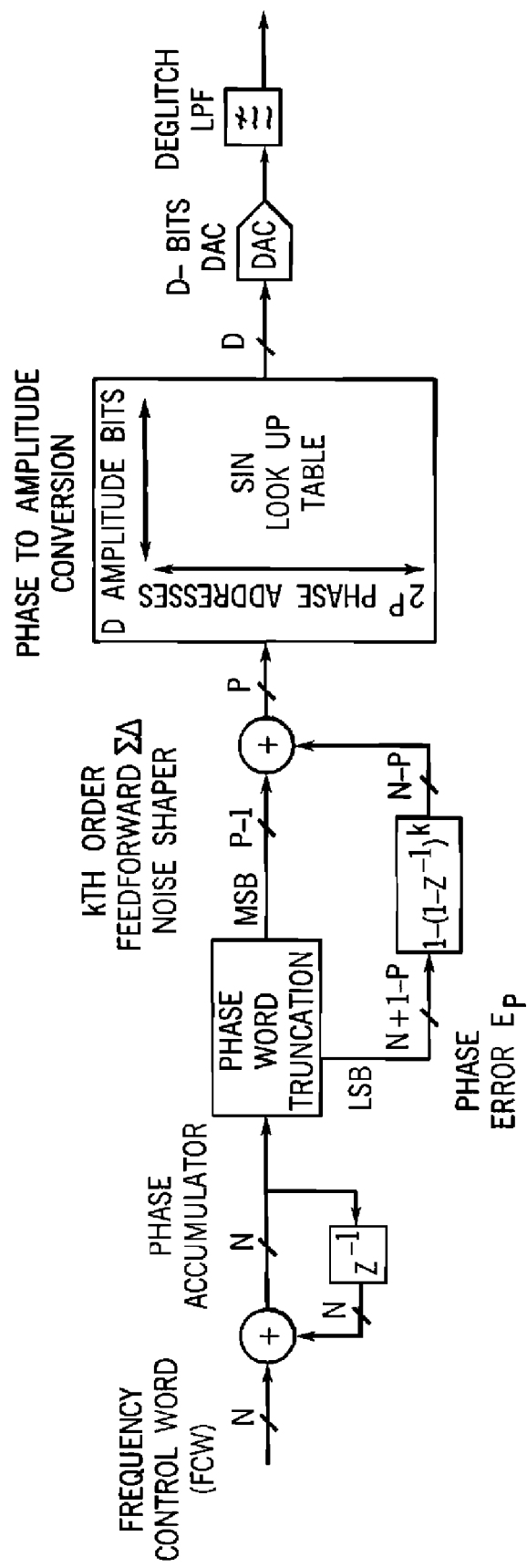
FIG. 3B illustrates a block diagram of a DDS with phase domain feedforward delta-sigma noise shaper according to an embodiment of the present invention.

FIGS. 3a and 3b illustrate the DDS architecture with a kth order phase domain $\Delta\Sigma$ noise shaper to reduce the phase truncation error.

Various delta-sigma topologies can be used to reduce the phase truncation errors in the proposed DDS architecture. Without losing the generality, we illustrate in FIGS. 3a and 3b two examples of implementing the phase domain noise shaper using a feedback delta-sigma modulator as shown in FIG. 2a or using a feedforward delta-sigma modulator as shown in FIG. 2b. For both phase domain feedback and feedforward delta-sigma noise shapers with the noise transfer function of $1-(1-z^{-1})^k$, the resulting DDS output can be expressed as $$S[n] = \sin\left(\frac{2\pi(\Phi[n] - E_p[n] \cdot (1-z^{-1})^k)}{2^N}\right) \quad (10)$$

$$\approx \sin\left(\frac{2\pi\Phi[n]}{2^N}\right) - \frac{2\pi E_p[n]}{2^N} \cdot (1-z^{-1})^k \cdot \cos\left(\frac{2\pi\Phi[n]}{2^N}\right)$$

It can be seen that the phase error Ep is high-pass filtered by the delta-sigma interpolator before the phase-to-amplitude conversion via the look-up table. It greatly reduces the close-in phase noise and de-correlates the phase truncation error. Thus, the spurious components at the DDS output are greatly reduced or eliminated.

Figure 4A:
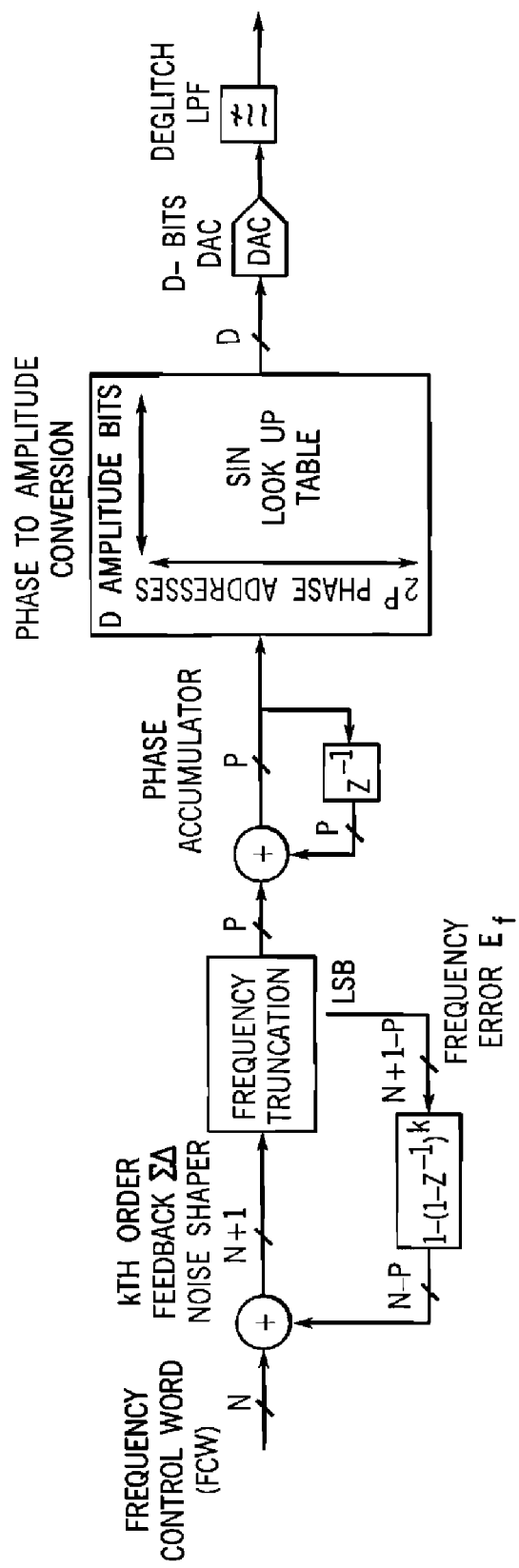
FIG. 4A illustrates a block diagram of a DDS with frequency domain feedback delta-sigma noise shaper according to an embodiment of the present invention.
Figure 4B:
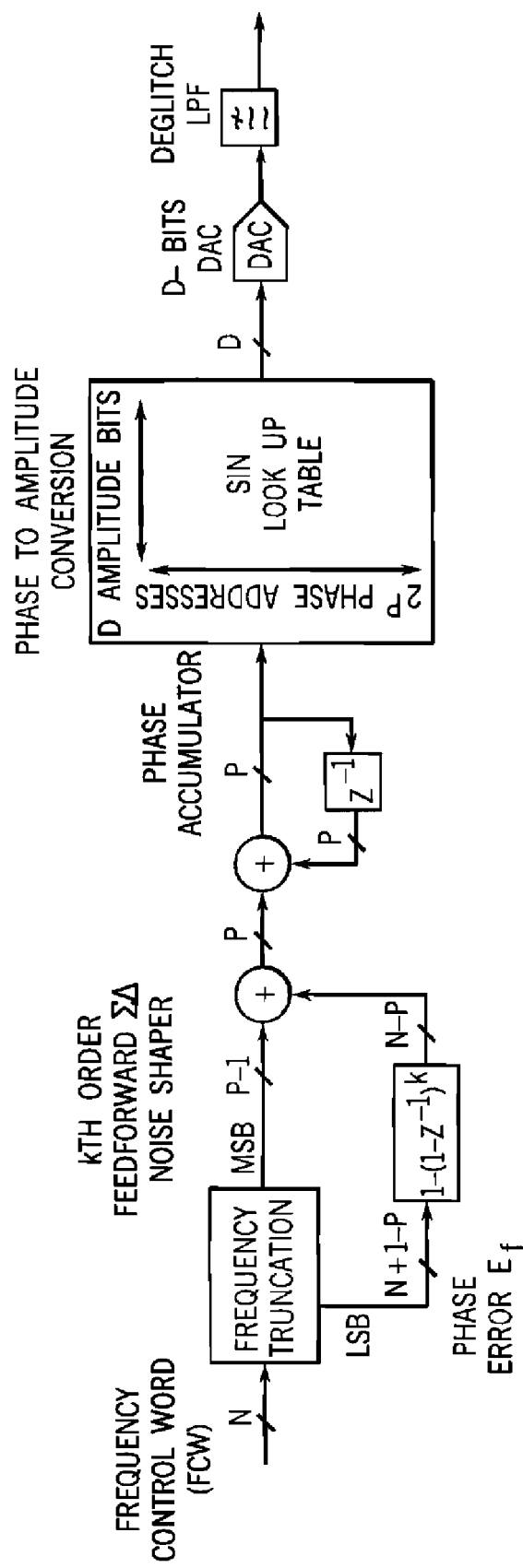
FIG. 4B illustrates a block diagram of a DDS with frequency domain feedforward delta-sigma noise shaper according to an embodiment of the present invention.

FIGS. 4a and 4b illustrate a DDS architecture with a kth order frequency domain $\Delta\Sigma$ noise shaper to reduce the phase truncation error.

Similar to phase domain delta-sigma noise shaping, we propose in FIGS. 4a and 4b the frequency domain noise shaper using a feedback delta-sigma modulator as shown in FIG. 4a or using a feedforward delta-sigma modulator as shown in FIG. 4b. For both frequency domain feedback and feedforward delta-sigma noise shapers with the noise transfer function of $1-(1-z^{-1})^k$, the resulting DDS output can be expressed as $$S[n] = \sin\left(\frac{2\pi \cdot FCW \cdot n}{2^N} - \frac{2\pi \cdot E_f[n] \cdot (1-z^{-1})^k}{2^P}\right) \quad (11)$$

$$\approx \sin\left(\frac{2\pi \cdot FCW \cdot n}{2^N}\right) - \frac{2\pi \cdot E_f[n]}{2^P} \cdot (1-z^{-1})^k \cdot$$

$$\cos\left(\frac{2\pi \cdot FCW \cdot n}{2^N}\right)$$

It can be seen that the frequency error $E_f$ is high-pass filtered by the delta-sigma interpolator before the phase accumulation. It greatly reduces the close-in phase noise and de-correlates the phase truncation error. Thus, the spurious components at the DDS output are greatly reduced or eliminated. Truncating the frequency control word before the phase accumulation also reduces the phase accumulator size. With the same accumulator size of N=32, the prior art DDS achieves $f_{clk}/2^{32}$ step size, while the proposed DDS with 64-to-32 bit frequency word truncation and a frequency domain delta-sigma noise shaper can achieve $f_{clk}/2^{64}$ step size.

Figure 5:
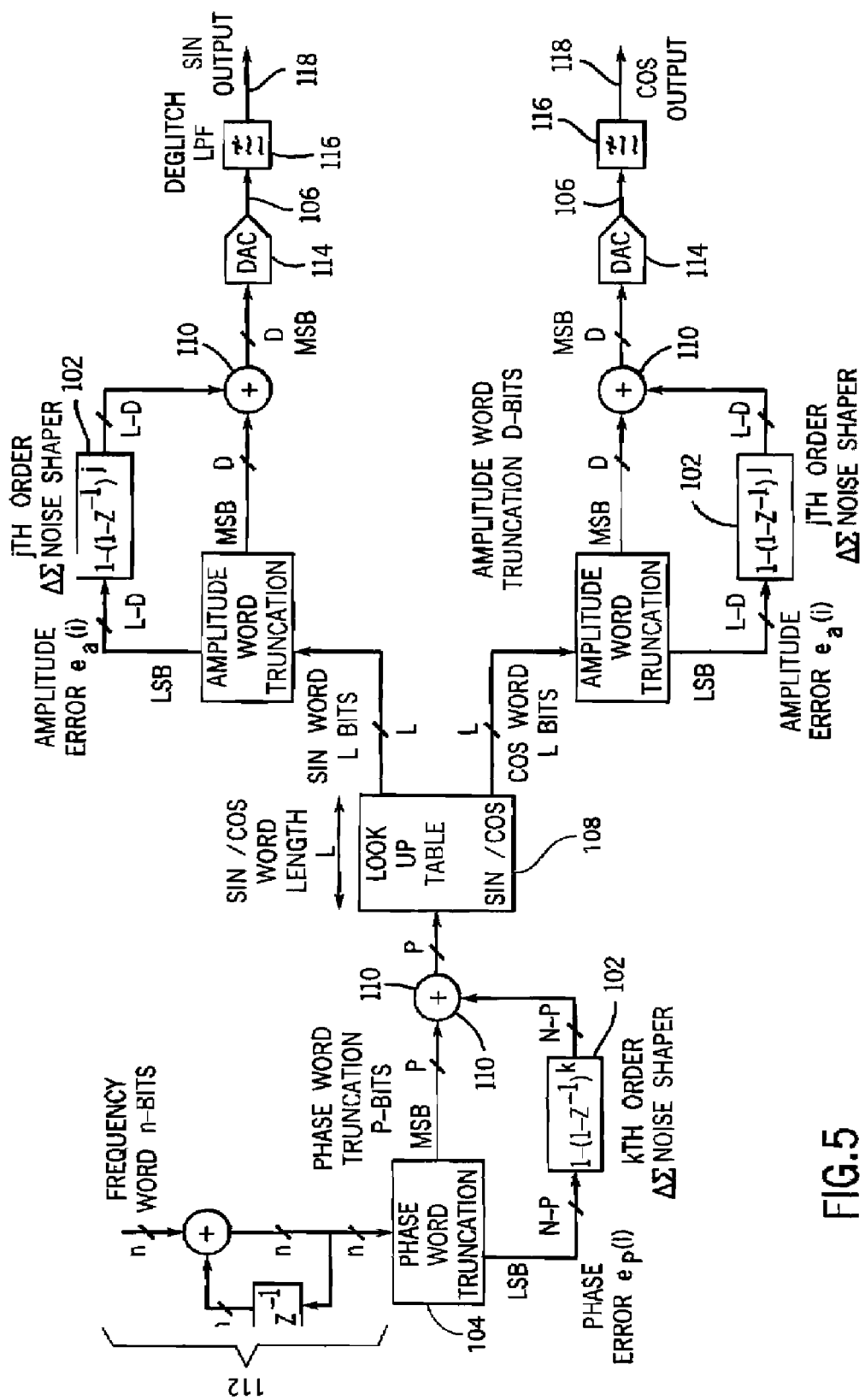
FIG. 5 illustrates a block diagram of a DDS with both phase domain and amplitude domain delta-sigma noise shapers according to an embodiment of the present invention.

FIG. 5 is a block diagram illustrating high-order delta-sigma noise shapers 102 and 110 used to shape both phase and amplitude truncation errors in a DDS 100 in accordance with an embodiment of the present invention. The phase and amplitude quantization errors can be again removed by using delta-sigma interpolators 102 and 110 as shown in FIG. 5.

Still referring to FIG. 5, the resulting DDS output 106 can be found as follows:

$$S \approx A \sin\left(\frac{2\pi W i}{2^n}\right) + A e_p(i)(1-z^{-1})^k \cos\left(\frac{2\pi W i}{2^n}\right) + A e_A(i)(1-z^{-1})^j \quad (12)$$

It can be seen that both phase truncation error $e_p$ and amplitude truncation error $e_A$ are high-pass filtered by the sigma-delta interpolators 102 and 110, and removed by the deglitch filters 116. The final output 118 after the deglitch filter is thus given by:

$$S \text{ (after deglitch } LPF) \approx A \sin\left(\frac{2\pi W i}{2^n}\right) \quad (13)$$

Still referring to FIG. 5, an ideal sinusoidal waveform with greatly reduced close-in phase noise and spurious components is achieved at the final output 118. This DDS architecture 100 achieves super low phase noise frequency synthesis through DDS 100 due to its low cost and capability of integration with digital CMOS ICs. This DDS architecture 100 can achieve equivalent phase noise to that of a PLL based analog synthesizer. Therefore, this DDS architecture 100 can eventually replace the PLL based synthesizer or be used as its tunable reference, resulting in tremendous commercial potential.

The implementations of the high-order pipelined single-stage delta-sigma modulators used in the proposed DDS are herein presented. Conceptually, if a block is inserted with transfer function of $H(z)=1-H_e(z)$ in an accumulator as shown in FIG. 6, the accumulator output becomes $$Y(z)=X(z)+A(z)H(z)-A(z)=X(z)-E(z)H_e(z) \quad (14)$$

where $Y(z)$ is taken from p-bits of MSB of the adder output $B(z)$ and $A(z)$ is obtained from the rest of $(n+1-p)$ bits of MSB of the adder output $B(z)$. It is evident that the input signal $X(z)$ is not affected by the modulator, while the quantization noise $E(z)$, which is truncated word $A(z)$, is filtered by the noise transfer function (NTF) $H_e(z)$. If the NTF $H_e(z)$ is the high-pass transfer function of $(1-z^{-1})^m$, namely, the feedback transfer function $H(z)=1-(1-z^{-1})^m$, the single-stage modulator is equivalent to a multi-stage noise shape (MASH) modulator with $Y(z)=X(z)-E(z)(1-z^{-1})^m$. If input frequency word $X(z)$ has n bits, $B(z)$ should have $(n+1)$ bits to protect the carry-out and $A(z)H(z)$ cannot exceed n bits. The modulator output $Y(z)$ can be of any number of bits, offering flexibility in choosing number of output bits. However, the maximum number of bits for $A(z)H(z)$ should be carefully calculated to prevent overflow of the adder.

Figure 6:
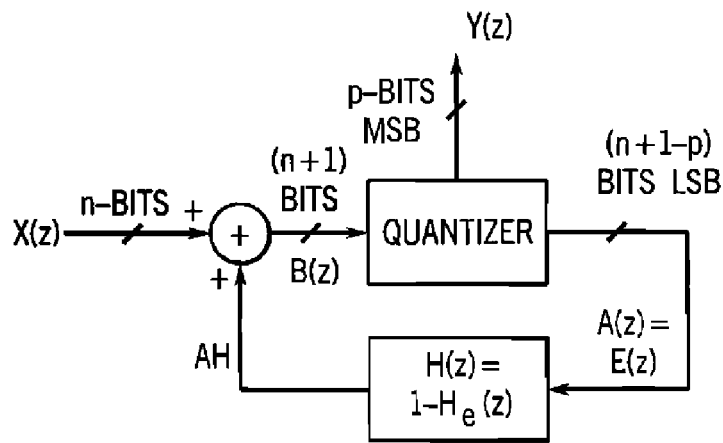
FIG. 6 illustrates a block diagram of a conceptual drawing of the single stage sigma-delta modulator.
Figure 7:
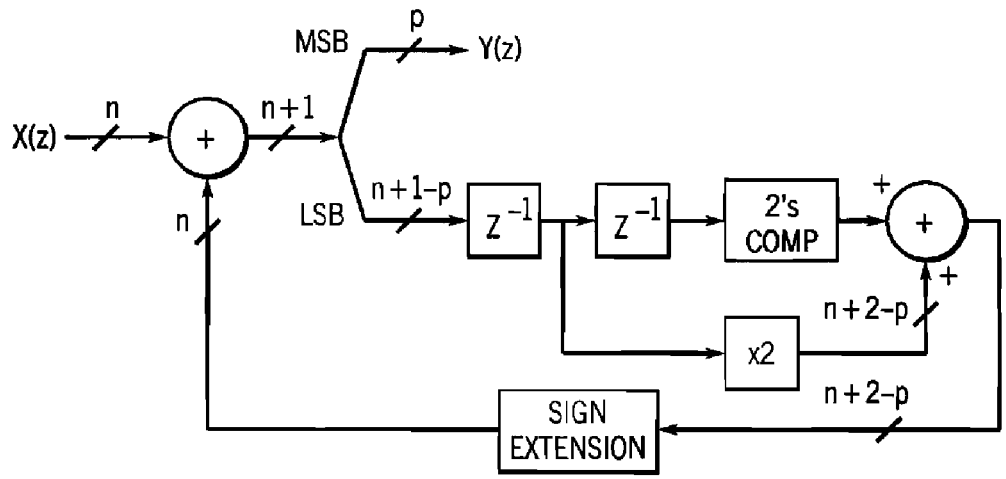
FIG. 7 illustrates a block diagram of a second order single stage sigma-delta modulator.

The conceptual single-stage sigma-delta modulator conceived in FIG. 6 can be implemented for any order of noise shaper in a pipelined topologies. For m=2, $H(z)=1-(1-z^{-1})^2=2z^{-1}-z^{-2}$. The implementation of the 2nd order modulator is presented in FIG. 7, where the subtraction is implemented using 2's complement format of $z^2$ term and multiplication by 2 is implemented using left shift operation. If n+2−p<n, sign extension is performed by extending the MSB of the (n+2−p)-bit word to obtain a n-bit word. As we can see, a condition of n+2−p≦n needs to be hold to prevent the first adder with (n+1)-bit output from losing the overflow bits. Hence, the minimum number of output bits of the 2nd order modulator is 2. In another word, the number of output bits for the given single-stage sigma-delta accumulator should be equal to or larger than the order of the modulator m.

Figure 8:
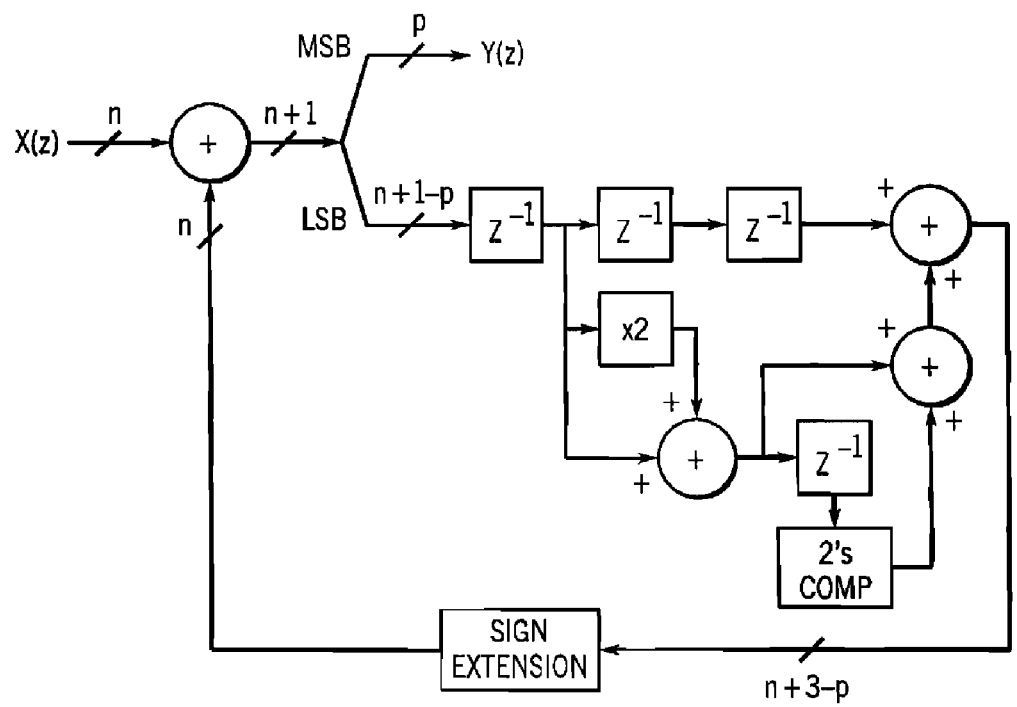
FIG. 8 illustrates a block diagram of a third order single stage sigma-delta modulator.

For m=3, $H(z)=1-(1-z^{-1})^3=z^{-1}(3-3z^{-1}+z^{-2})$. The implementation of the 3rd order single-stage $\Sigma\Delta$ modulator is given in FIG. 8. Multiplication by 3 is implemented using left shift operation (×2) followed by addition, namely, $3z^{-1}=2z^{-1}+z^{-1}$.

Figure 9:
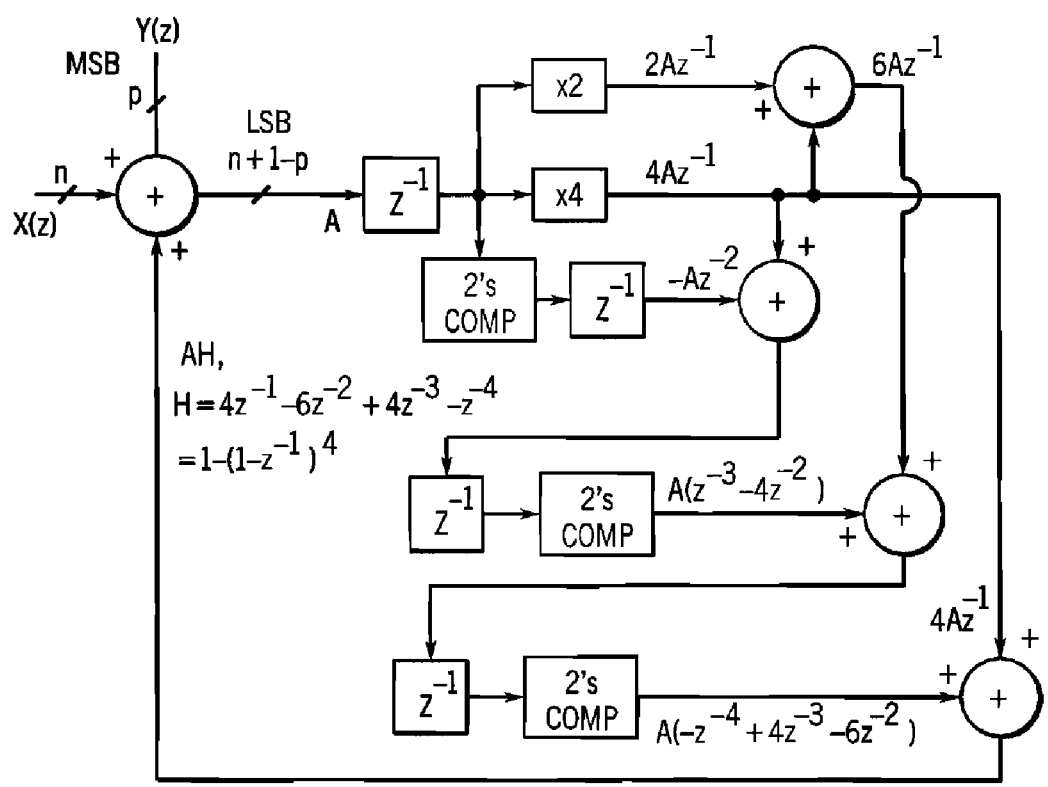
FIG. 9 illustrates a block diagram of a fourth order single stage sigma-delta modulator.
Figure 10:
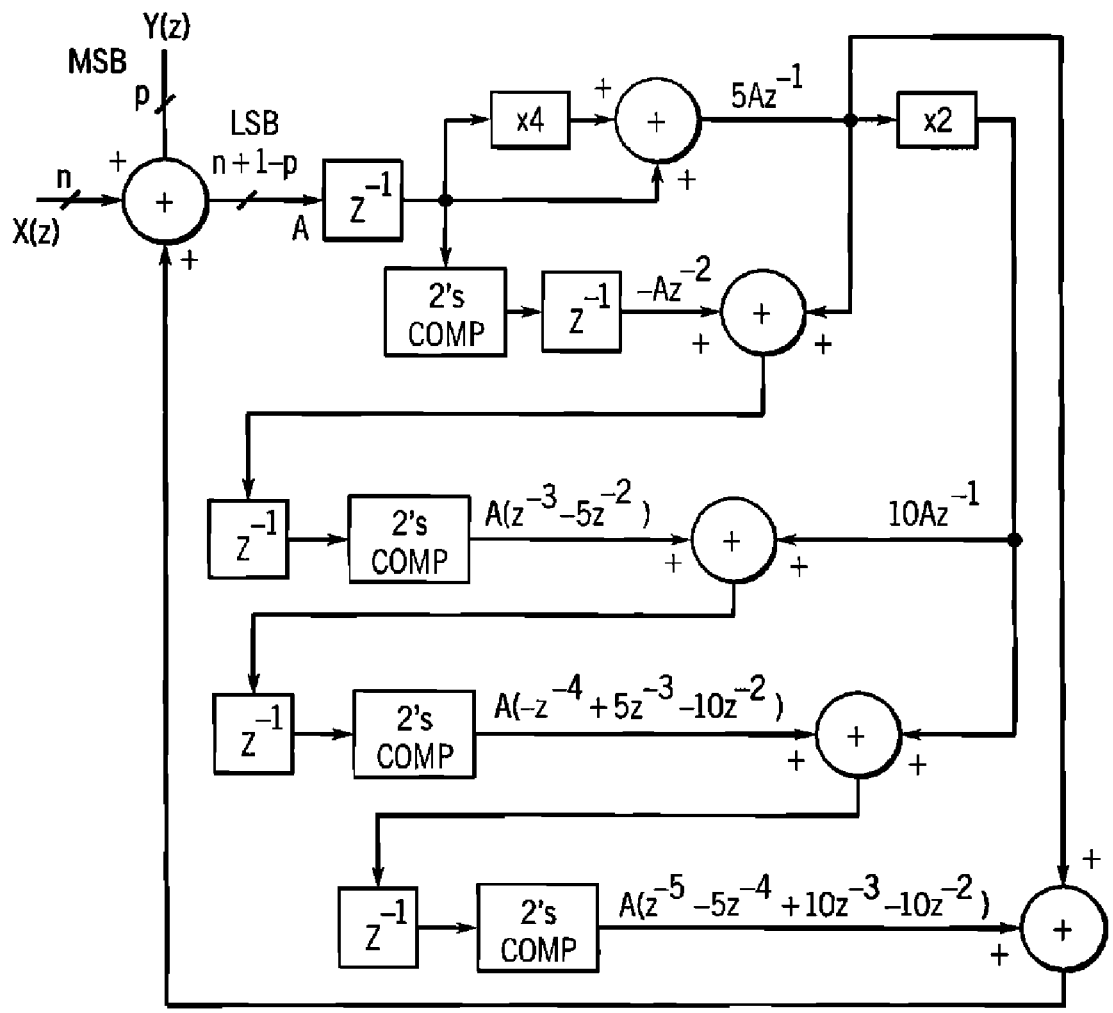
FIG. 10 illustrates a block diagram of a fifth order single stage sigma-delta modulator.

The implementation of the fourth-order and fifth-order single-stage sigma-delta modulators are illustrated in FIG. 9 and FIG. 10, respectively. They are somewhat more complicated compared to the second and third order modulators. The fourth order single-stage sigma delta modulator uses a transfer function of $H(z)=1-(1-z^{-1})^4=4z^{-1}-6z^{-2}+4z^{-3}-z^{-4}$, while the fifth-order single-stage sigma-delta modulator has a transfer function of $H(z)=1-(1-z^{-1})^5=5z^{-1}-10z^{-2}+10z^{-3}-5z^{-4}+z^{-5}$. To speed up the circuits, those transfer functions are implemented in a pipelined manner. To avoid using multipliers, which can be the area and speed bottlenecks, the transfer function $H(z)$ is manipulated such that only shifting operations are involved. The speed of the single-stage $\Sigma\Delta$ modulator topology is limited by the delay times associated with the additions to calculate the transfer function $H(z)$. The higher the order of the $\Sigma\Delta$ modulator, the longer the delay.

The proposed single stage $\Sigma\Delta$ modulators are stable if the number of outputs bits is equal to or larger than the order of the modulator k. If another type of $\Sigma\Delta$ modulator is used for noise shaping, its stability needs to be carefully analyzed. $\Sigma\Delta$ modulators are non-linear systems and their stability analysis is different from linear system analysis. Instability occurs when the input amplitude or the frequency of the $\Sigma\Delta$ modulator exceed a certain value depending on the modulator structure. Under unstable conditions, low frequency signal swing between the minimum and maximum amplitude occurs at the quantizer input. As a result, the quantizer output is saturated (overloaded) and the $\Sigma\Delta$ modulator can no longer track the input signal. For a single-bit quantizer, the saturated quantizer output corresponds to long sequences of ones followed by long sequences of zeros also called limit cycles. It is very difficult for the modulator to get out of the saturated state hence the $\Sigma\Delta$ modulator becomes unstable.

Figure 11A:
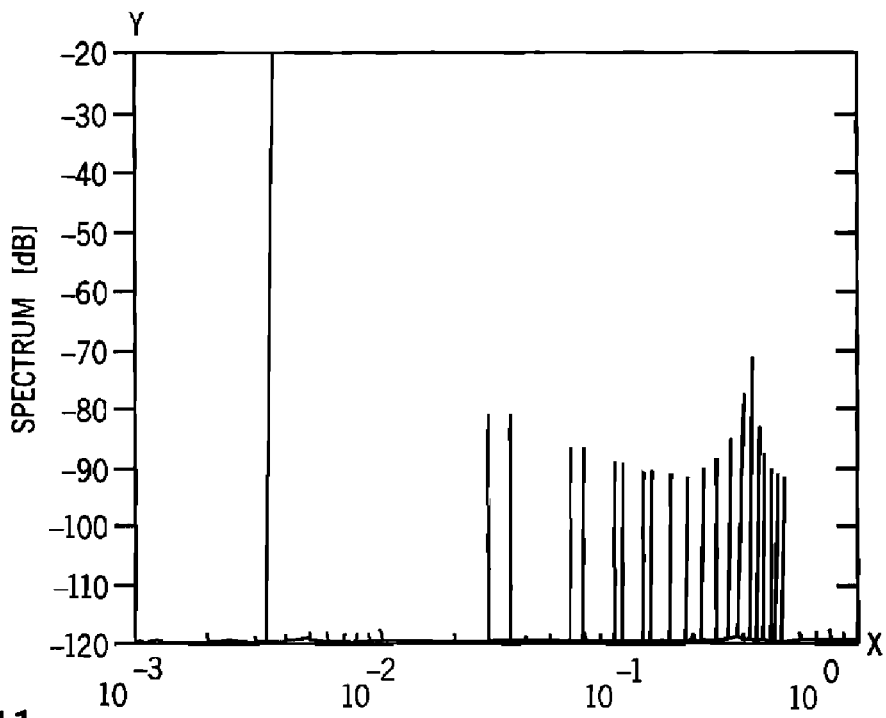
FIG. 11A illustrates a spectrum plot after phase truncation of the prior art.
Figure 11B:
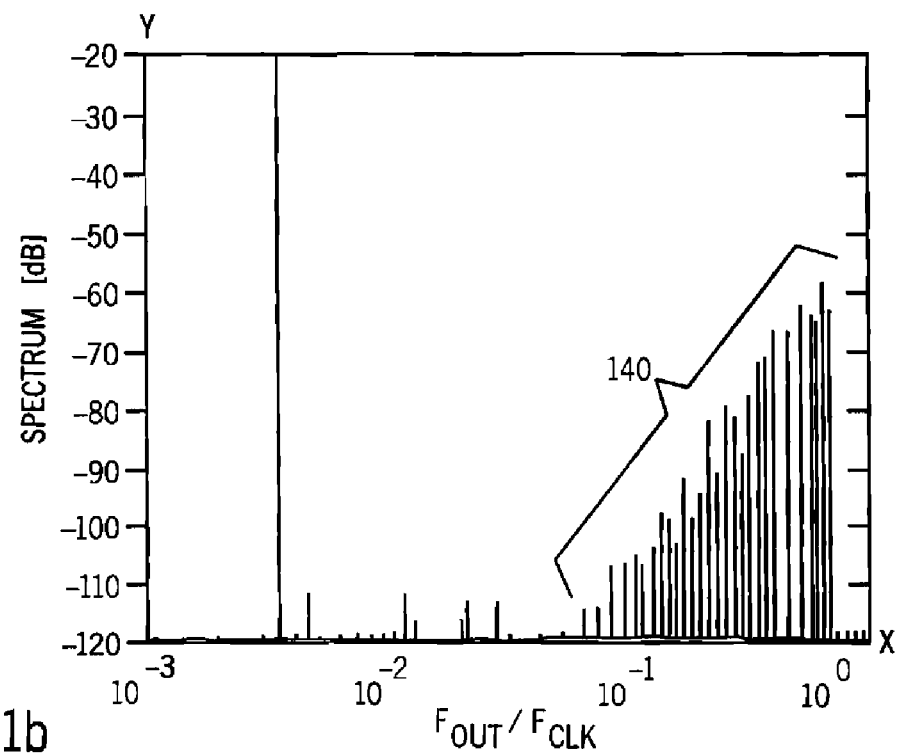
FIG. 11B illustrates a spectrum after phase truncation and delta-sigma noise shaping according to an embodiment of the present invention.

To verify the performance of the proposed DDS with high-order $\Sigma\Delta$ modulators, FIG. 11*a* illustrates a spectrum plot after the phase truncation in a conventional DDS of the prior art, while FIG. 11*b* illustrates the spectrum for the DDS architecture 100 (FIG. 2) using a $4^{th}$ order delta-sigma noise shaper 102. In both FIGS. 11*a* and 11*b* (as well as the following FIGS. 12*a* and 12*b*), the graphical representation illustrated plots $F_{out}/F_{clk}$ on the x-axis against the spectrum in decibels [dB] on the y-axis. FIG. 11*b* clearly demonstrated high-pass noise shaping effect of the $4^{th}$ order delta-sigma interpolator with 80 dB/dec slope 120.

Figure 12A:
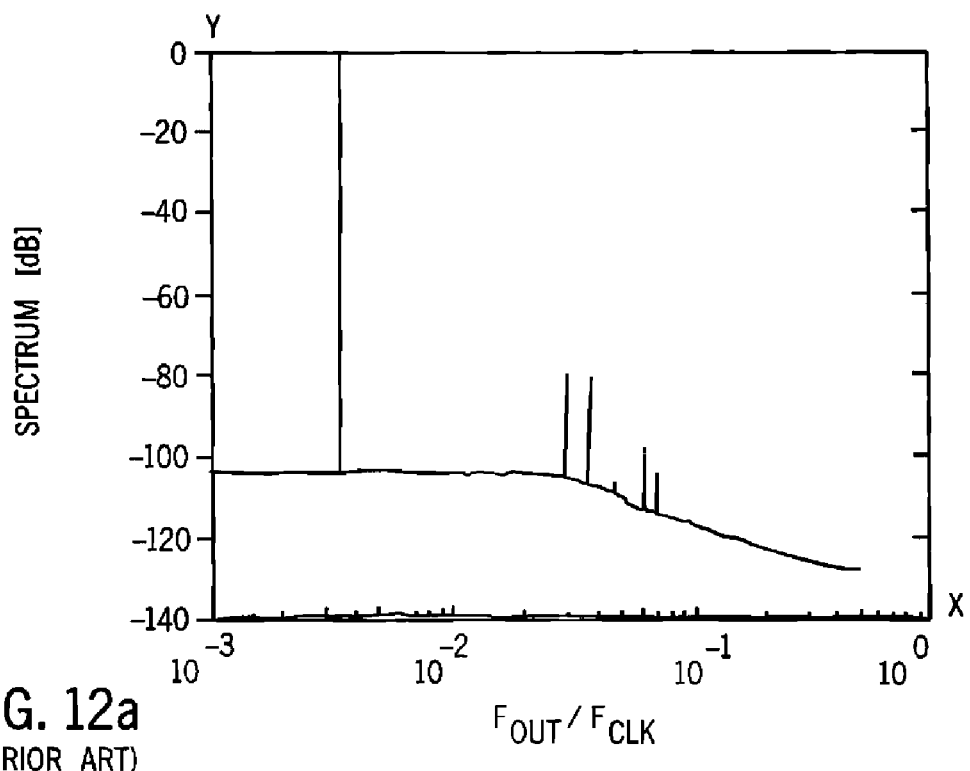
FIG. 12A illustrates the spectrum after the deglitch filter of the prior art DDS.
Figure 12B:
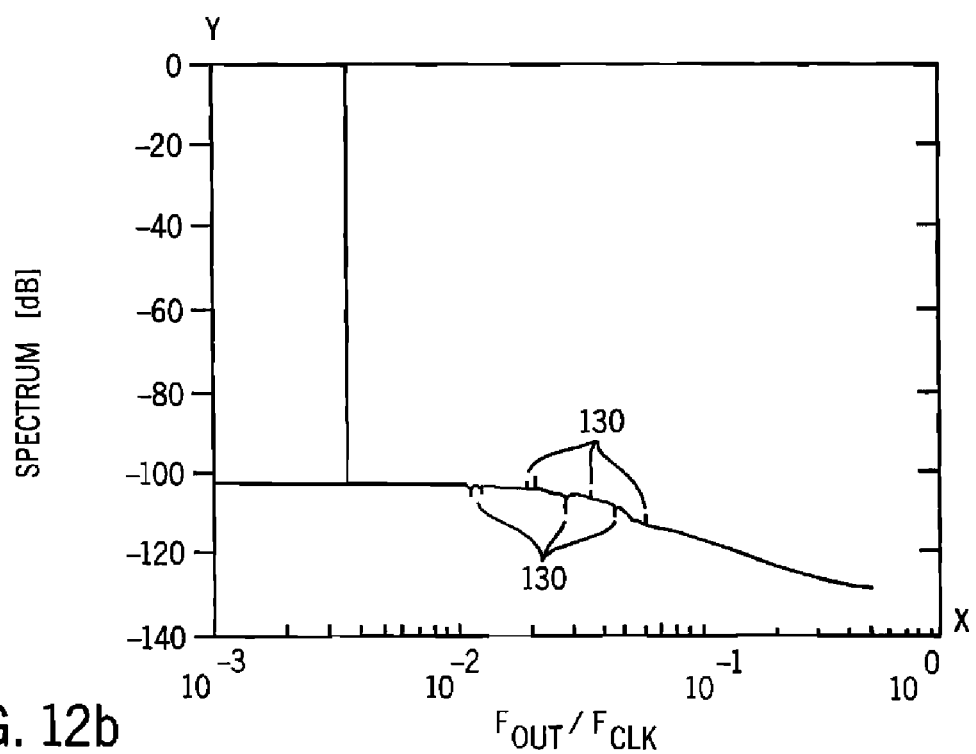
FIG. 12B illustrates the spectrum after the deglitch filter of the DDS with delta-sigma noise shaping according to an embodiment of the present invention.

FIG. 12*a* illustrates the spectrum plot after the deglitch filter in a conventional DDS, while FIG. 12*b* illustrates the spectrum plot after the deglitch filter for the DDS architecture 100 using a $4^{th}$ order delta-sigma noise shaper. FIG. 12*b* clearly shows that the spurs 130 associated with the phase truncation are filtered by the deglitch filter and clean spectrum purity, to a point below −100 dBc. In the simulation utilized to produce FIGS. 11*a*-12*b*, the number of DAC bits was D=16, the number of accumulator bits was n=18, the number of phase bits was p=12, the oversample rate was set to DDS=300, and an 8th order Butterworth LPF with a cut-off at 0.1 was used as the deglitch filter.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

I claim:

1. A direct digital synthesis (DDS) circuit for removing phase quantization and truncation errors from a phase word received from a phase accumulator, the DDS circuit comprising:
   a) a phase word truncator, wherein the phase word truncator truncates the phase word and outputs a phase error;
   b) a delta-sigma noise shaper configured to remove the phase error from the phase word; and
   c) a look-up table configured to output a sin amplitude word and a cosine amplitude word corresponding to the phase word.

2. The DDS circuit according to claim 1, wherein the delta-sigma noise shaper is configured in a feedforward manner.

3. The DDS circuit according to claim 1, wherein the delta-sigma noise shaper is configured in a feedback manner.

4. The DDS circuit according to claim 1, further comprising a digital to analog converter configured to receive the sin and cosine amplitude words, and further configured to produce a DDS output.

5. The DDS circuit according to claim 4, further comprising a deglitch filter configured to receive the DDS output, and further configured to produce a deglitch output.

6. The DDS circuit according to claim 1, further comprising an accumulator configured to receive a frequency word, and further configured to provide the phase word corresponding to the frequency word to the DDS.

7. The DDS circuit according to claim 1, further comprising a delta-sigma interpolator that receives the phase error from the phase word truncator and moves the phase error to a high-frequency band where it is removed by a deglitch low-pass filter after a digital-to-analog converter (DAC).

8. A direct digital synthesis (DDS) circuit for removing frequency quantization and truncation errors from a frequency word, the DDS circuit comprising:
   a) a frequency word truncator, wherein the frequency word truncator truncates the frequency word and outputs a frequency error;
   b) a delta-sigma noise shaper configured to remove the frequency error from the frequency word; and
   c) a phase accumulator configured to receive the frequency word, after the frequency error is removed.

9. The DDS circuit according to claim 8, further comprising a look-up table configured to output a sin amplitude word and a cosine amplitude word corresponding to the frequency word.

10. The DDS circuit according to claim 9, further comprising a digital-to-analog converter(DAC) configured to receive a sin amplitude word and a cosine amplitude words from the look up table, and further configured to produce a DDS output.

11. The DDS circuit according to claim 10, further comprising a deglitch filter configured to receive the DDS output from the digital-to-analog converter(DAC), and further configured to produce a deglitch output.

12. The DDS circuit according to claim 8, wherein the delta-sigma noise shaper is configured in a feedforward manner.

13. The DDS circuit according to claim 8, wherein the delta-sigma noise shaper is configured in a feedback manner.

14. The DDS circuit according to claim 8, further comprising delta sigma interpolator that receives the frequency error from the frequency word truncator and moves the frequency error to a high-frequency band where it is removed by a deglitch low-pass filter after a DAC.

15. A direct digital synthesis (DDS) circuit for removing amplitude quantization and truncation errors, the DDS circuit comprising:
   a) a look-up table configured to output a sin amplitude word and a cosine amplitude word corresponding to a phase word;
   d) an amplitude truncator configured to receive the sin amplitude word and the cosine amplitude word from the look-up table, wherein the amplitude word truncator truncates the sin amplitude word and the cosine amplitude word and outputs an amplitude error; and
   e) a delta-sigma noise shaper configured to remove the amplitude error from the sin amplitude word and the cosine amplitude word.

16. The DDS circuit according to claim 15, wherein the delta-sigma noise shaper is configured in a feedforward manner.

17. The DDS circuit according to claim 15, wherein the delta-sigma noise shaper is configured in a feedback manner.

18. The DDS circuit according to claim 15, further comprising a digital to analog converter configured to receive the sin and cosine amplitude words from the delta-sigma noise shaper, and further configured to produce a DDS output.

19. The DDS circuit according to claim 18, further comprising a deglitch filter configured to receive the DDS output, and further configured to produce a deglitch output.

20. The DDS circuit according to claim 15, further comprising a delta-sigma interpolator that receives the amplitude error from the amplitude word truncator and moves the amplitude error to a high-frequency band where it is removed by a deglitch low-pass filter after a DAC.

21. A single-stage, delta-sigma modulator comprising an accumulator, the accumulator including an adder, a quantizer and a noise transfer block, wherein the noise transfer block includes a transfer function of $H(z)=1-H_e(z)$, and further wherein $H_e(z)$ is a desired noise transfer function.

22. The modulator according to claim 21, wherein a kth order high-pass noise transfer function is $H_e(z)=(1-z^{-1})^k$, and a feedback transfer function is $H(z)=1-(1-z^{-1})^k$.

* * * * *

UNITED STATES PATENT AND TRADEMARK OFFICE
CERTIFICATE OF CORRECTION

PATENT NO. : 7,577,695 B2  Page 1 of 1
APPLICATION NO. : 11/187365
DATED : August 18, 2009
INVENTOR(S) : Fa Dai It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1061 days.

Signed and Sealed this

Seventh Day of September, 2010

David J. Kappos
*Director of the United States Patent and Trademark Office*